US011810968B1

(12) United States Patent
Tahan et al.

(10) Patent No.: US 11,810,968 B1
(45) Date of Patent: Nov. 7, 2023

(54) METHOD FOR INDUCED QUANTUM DOTS FOR MATERIAL CHARACTERIZATION, QUBITS, AND QUANTUM COMPUTERS

(71) Applicant: The Government of the United States as represented by the Director, National Security Agency, Ft. George G. Meade, MD (US)

(72) Inventors: Charles George Tahan, Kensington, MD (US); Rousko Todorov Hristov, College Park, MD (US); Yun-Pil Shim, Marriotsville, MD (US); Hilary Hurst, Washington, DC (US)

(73) Assignee: Government of the United States, as represented by the Director, National Security Agency

( * ) Notice: Subject to any disclaimer, the term of this patent is extended or adjusted under 35 U.S.C. 154(b) by 0 days.

(21) Appl. No.: 17/864,617

(22) Filed: Jul. 14, 2022

Related U.S. Application Data

(62) Division of application No. 16/552,764, filed on Aug. 27, 2019, now Pat. No. 11,444,184.

(60) Provisional application No. 62/723,315, filed on Aug. 27, 2018.

(51) Int. Cl.
| | |
|---|---|
| *H01L 29/66* | (2006.01) |
| *H01L 29/165* | (2006.01) |
| *G06N 10/00* | (2022.01) |
| *H01L 21/265* | (2006.01) |
| *H01L 29/06* | (2006.01) |
| *H01L 29/423* | (2006.01) |

(52) U.S. Cl.
CPC ....... *H01L 29/66977* (2013.01); *G06N 10/00* (2019.01); *H01L 21/26513* (2013.01); *H01L 29/0665* (2013.01); *H01L 29/165* (2013.01); *H01L 29/42312* (2013.01)

(58) Field of Classification Search
CPC .... G06N 10/00; G06N 10/40; H01L 29/0665; H01L 29/66977; H01L 29/165; H01L 29/42312; H01L 21/26513; B82Y 10/00; G01R 29/24; G01R 31/2831
USPC .......................................................... 257/24
See application file for complete search history.

(56) References Cited

U.S. PATENT DOCUMENTS

| | | | |
|---|---|---|---|
| 6,627,914 B1 * | 9/2003 | Komiyama ............ | B82Y 10/00 257/457 |
| 9,691,033 B2 * | 6/2017 | Rogge ............... | H01L 29/66977 |
| 9,852,927 B2 * | 12/2017 | Amani ................ | C09K 11/681 |
| 9,886,668 B2 * | 2/2018 | Dzurak ............... | H03K 19/195 |

(Continued)

*Primary Examiner* — Khiem D Nguyen

(57) ABSTRACT

A method is disclosed, including positioning a lead wire of a gate chip at a distance of less than 10 nm from a semiconductor heterostructure. The heterostructure includes a surface layer and a subsurface layer. The method also includes inducing an electrostatic potential in the subsurface layer by applying a voltage to the lead wire. The method also includes loading a charge carrier into the subsurface layer. The method also includes detecting the charge carrier in the subsurface layer of the semiconductor heterostructure by emitting a radio-frequency pulse using a resonator coupled to the at least one lead wire of the gate chip, detecting a reflected pulse of the emitted radio-frequency pulse, and determining a phase shift of the reflected pulse relative to the emitted radio-frequency pulse. The method also includes characterizing the quantum dot by measuring valley splitting of the quantum dot.

4 Claims, 26 Drawing Sheets

(56) References Cited

U.S. PATENT DOCUMENTS

| | | | |
|---|---|---|---|
| 2007/0063182 A1* | 3/2007 | Yang | H01L 29/7613 257/14 |
| 2014/0150860 A1* | 6/2014 | Morr | B82Y 10/00 257/15 |
| 2014/0319459 A1* | 10/2014 | Homyk | B82Y 10/00 257/14 |
| 2015/0171197 A1* | 6/2015 | Taylor | H01S 5/06203 257/24 |
| 2016/0315452 A1* | 10/2016 | Chen | G02B 6/34 |
| 2017/0116542 A1* | 4/2017 | Shim | G06N 10/00 |

* cited by examiner

METHOD FOR INDUCED QUANTUM DOTS FOR MATERIAL CHARACTERIZATION, QUBITS, AND QUANTUM COMPUTERS

CROSS REFERENCE TO RELATED APPLICATIONS

This application is a divisional of patent application Ser. No. 16/552,764, filed Aug. 27, 2019, now U.S. Pat. No. 11,444,184, titled "System for Induced Quantum Dots for Material Characterization, Qubits, and Quantum Computers," naming Charles Tahan, Rousko Hristov, Yun-Pil Shim, and Hilary Hurst as inventors; which claims priority to provisional patent application Ser. No. 62/723,315, filed Aug. 27, 2018, titled "Induced Quantum Dots for Material Characterization and Quantum Computing," naming Charles Tahan, Rousko Hristov, Yun-Pil Shim, and Hilary Hurst as inventors. The contents of both of these applications are hereby incorporated by reference herein in their entirety.

FIELD OF THE INVENTION

The present invention relates generally to quantum dots and semiconductor qubit-based quantum computers, and in particular to the creation of quantum dots and qubits for characterization of materials and qubit properties without the need to fabricate quantum dots.

SUMMARY

One embodiment of the present invention is a system including a gate chip having at least one lead wire. The system also includes a semiconductor hetero structure having a surface layer and at least one subsurface layer. The gate chip is configured to induce a quantum dot in the subsurface layer of the semiconductor heterostructure using the lead wire. Inducing the quantum dot includes inducing an electrostatic potential in the subsurface layer by applying a voltage to the lead wire such that an energy of the first excited orbital level of the induced quantum dot is larger than an effective temperature bath in the subsurface layer.

In a related embodiment, the lead wire has a cross-sectional width between 5 nm and 30 nm. In a further related embodiment, a gap distance between the gate chip and the semiconductor heterostructure is less than 10 nm. In a further related embodiment, the voltage applied to the lead wire is between 0.01 V and 0.2 V.

In another related embodiment, inducing the quantum dot also includes loading a charge carrier into the subsurface layer. In a further related embodiment, loading the charge carrier into the subsurface layer includes creating a plurality of carriers in the semiconductor heterostructure by external excitation of photons with an energy greater than a bandgap energy of the semiconductor heterostructure. Alternatively, loading the charge carrier into the subsurface layer includes implanting a region of donors introducing doped regions of extra charge carriers into the semiconductor heterostructure and, after the implanting, moving the lead wire of the gate chip near the doped regions to pull the charge carrier into the induced dot. Alternatively, loading the charge carrier into the subsurface layer includes implanting a region of donors introducing doped regions of extra charge carriers into the semiconductor heterostructure and creating a bath gate using one of the plurality of lead wires to load charge carriers from the doped region into the induced quantum dot in the subsurface layer of the semiconductor heterostructure.

In another embodiment, the at least one lead wire includes a plurality of lead wires, and the gate chip is further configured to induce a plurality of quantum dots in the semiconductor hetero structure, adapted for use in a multiple quantum dot qubit quantum computer.

Another embodiment is method. The method includes positioning at least one lead wire of a gate chip at a distance of less than 10 nm from a semiconductor heterostructure. The lead wire has a cross sectional width between 5 nm and 30 nm. The semiconductor heterostructure includes a surface layer and at least one subsurface layer. The method also includes inducing an electrostatic potential in the subsurface layer by applying a voltage between 0.01 V and 0.2 V to the lead wire such that an energy of the first excited orbital level of the induced quantum dot is larger than an effective temperature bath in the subsurface layer.

The method also includes loading a charge carrier into the subsurface layer. The method also includes detecting the charge carrier in the subsurface layer of the semiconductor heterostructure by emitting a radio-frequency pulse using a resonator having a Q factor of at least $10^3$ coupled to the at least one lead wire of the gate chip, detecting a reflected pulse of the emitted radio-frequency pulse, and determining a phase shift of the reflected pulse relative to the emitted radio-frequency pulse. The method also includes characterizing the quantum dot by measuring valley splitting of the quantum dot.

In another embodiment, the at least one lead wire includes a plurality of lead wires, and the gate chip is further configured to induce a plurality of quantum dots on the semiconductor heterostructure, adapted for use in a multiple quantum dot qubit quantum computer.

DETAILED DESCRIPTION

Figure 1A:
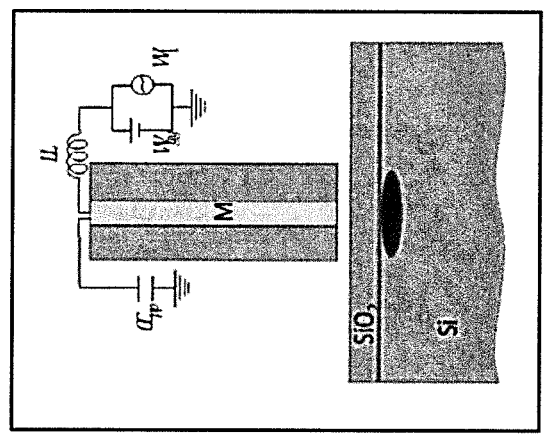
FIGS. 1(a) and 1(b) are schematic diagrams of systems in accordance with embodiments of the present invention.

In accordance with embodiments of the present invention, a semiconductor wafer may be characterized in a non-destructive fashion by measuring the parameters of an induced quantum dot qubit on the material system of interest with a separate gate chip that can also house the measurement circuitry. The inventors have appreciated that a single wire can be used to not only create the dot, and also to determine if an electron is present, and to measure critical device parameters relevant for quantum computing. Adding more wires enables more complicated (potentially multi-dot) systems and measurements. In an illustrative embodiment, a silicon metal-oxide (MOS) semiconductor inversional layer or a silicon/silicon-germanium quantum well material system may be used to create quantum dot qubits relevant to quantum computing, and it is possible to measure low-lying excited states (so-called "valley" states). This approach provides an alternative way to perform the characterization of parameters that are critical for various semiconductor-based quantum dot devices without fabricating such devices.

Semiconductor heterostructures often serve as the substrate for many solid-state devices. For quantum devices such as qubits, their quality depends crucially on the properties of these wafers. Often, these qubit characterization parameters can only be ascertained by fabricating the device and measuring it at cryogenic temperatures. Quantum dots (QDs) in silicon for quantum computing (QC) are a great example. The indirect band-gap of silicon creates low-lying excited (valley) states in the QD heterostructure; if the "valley splitting" is too small, initialization, readout and even gate operation of the qubits are impeded. Optimizing the valley splitting of silicon QD qubits—in addition to other important parameters such as coherence time, charge noise, etc.—is needed for the eventual construction of quantum computers, and is limited by the design-fabrication-test cycle time.

Methods are disclosed for characterizing material properties using a separate gate chip that both creates the dot(s) and measures them. These methods operate according to similar principles as the ion trap stylus approach, where an ion qubit is trapped on a stylus-like tip that can be brought close to a material to characterize its properties, and also by the scanning nitrogen-vacancy (NV) center tip which can be used to detect magnetic fields on a nanoscale for imaging or to couple to spin qubits. While these methods involve putting a qubit on the scanning tip itself, according to the presently-disclosed embodiments, a separate gate chip induces a qubit in the material structure under study, then measures those material and qubit parameters of interest using the circuits on the gate chip. Scanning tunneling microscope (STM) tips have been used to create effective dots on the surface of InAs and, more recently, Si, using tunneling to perform spectroscopy. Nondestructive characterization of embedded donor atoms in a semiconductor has also been demonstrated using a scanning tip architecture. Here, however, the dot qubit is induced within the material in an environment realistic to quantum computing in a system compatible with dispersive readout for characterizing material and qubit properties.

To demonstrate viability of the presently-described approach, exemplary embodiments were considered having silicon metal-oxide-semiconductor (MOS) type and silicon/silicon-germanium quantum well (QW) type structures as examples to investigate the relevant properties of silicon-based qubit devices. First, the general geometry of the heterostructure wafer and the gate chip will be described and electrostatic simulations of the induced QD provided. Then, it will be demonstrated how to load the QD and detect the electron by a dispersive readout using the quantum capacitance of the induced QD all with the same wire. Finally, techniques will be discussed for measuring the valley splitting based on a much stronger quantum capacitance of the qubit levels at spin-valley anti-crossing using one or more wires.

FIGS. 1(a)-1(d) show schematic pictures of a setup in accordance with an embodiment of the present invention. The gate chip containing the required trapping and the measurement circuitry is placed perpendicularly above a semiconductor structure, such as a MOS, [FIG. 1(a)] or Si/SiGe QW structure, [FIG. 1(b)]. Applying a positive voltage $V_g$ to the gate wire induces a confining electrostatic potential in the 2D quantum well in the structure [FIG. 1(c)], and orbital wavefunctions $\psi_i$ show typical 2D QD orbital characters [FIG. 1(d)]. Electrons can be trapped into the induced QD as shown in FIG. 1(a) for the MOS and FIG. 1(b) for the QW. The energy levels of the induced QDs have nonzero second derivative with respect to the applied voltage (i.e., a quantum capacitance), allowing for a dispersive readout by coupling to a detector circuit which can be integrated in the gate chip.

Figure 1B:
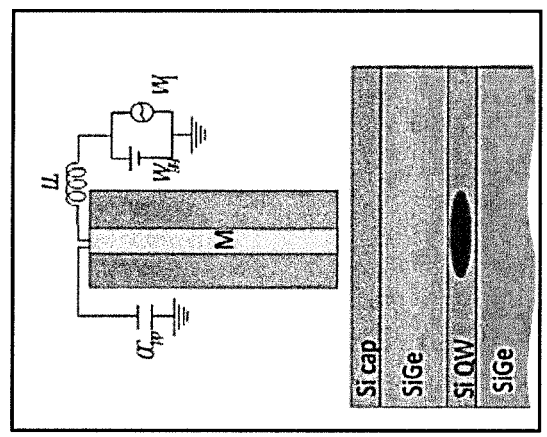
Figure 1C:
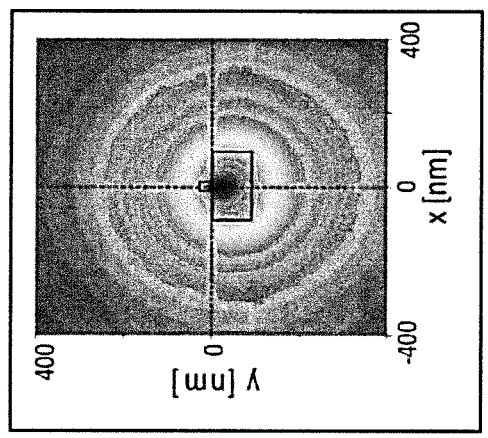
FIG. 1(c) is a graph showing potential induced in operation of a system in accordance with embodiments of the present invention.
Figure 1D:
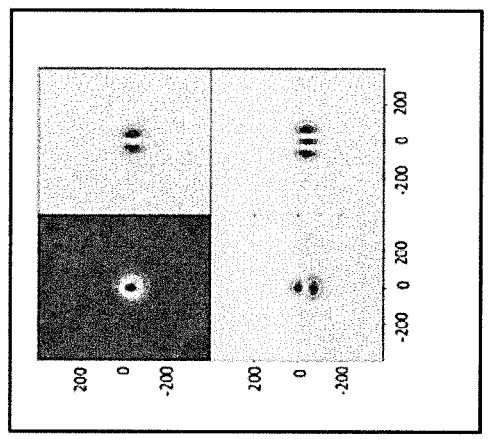
FIG. 1(d) is a graph showing orbital wave functions in the potential.

As just discussed, FIGS. 1(a) and 1(b) are schematic diagrams of devices, for MOS and QW structures. A Si wafer chip with a metallic gate wire M on it (and other necessary circuitry; L is the inductance and $C_p$ is the unavoidable parasitic capacitance) is positioned above the semiconductor heterostructure to induce a QD for non-invasive characterization. DC and AC voltages can be simultaneously applied to the gate wire for inducing the quantum dot and its characterization. Wire induced QD confining potential and four lowest orbitals, Re[$\psi_i$], in a MOS device with a DC gate voltage $V_g$=0.02 V are shown in FIGS. 1(c) and 1(d), respectively.

The inventors have performed electrostatic simulation of devices in accordance with embodiments of the present invention using dimensions for MOS and QW devices that are typically used in experiments. For a MOS structure, a silicon oxide layer of 10 nm overlays the silicon substrate of ≳200 nm. For a QW structure, a strained silicon quantum well of 10 nm is sandwiched between a ≳200 nm SiGe substrate and a 40 nm SiGe spacer which is capped by 10 nm of silicon. The gate wire size is chosen to be 10 nm 10 nm and 1 μm long, and 10 nm away from the top of the heterostructure. Using different sizes of gate wafers as well as a bare metallic wire tip with no gate wafer for the simulations have been demonstrated to obtain qualitatively similar results. Results are presented below for the gate wire on a silicon wafer of 100 nm depth and 200 nm width.

To conduct measurements of useful device properties, especially for properties relevant for spin qubits, it is necessary to populate the induced quantum dot with a controlled number of electrons. This can be achieved in a number of different ways: e.g., (i) an electron-hole pair can be generated near the induced QD by light (see FIG. 6), and the electron is trapped into the QD, while the hole is pushed away from the QD by the electrostatic force, or (ii) one can dope the semiconductor by implanting donors in a specific region (or use a large "electron bath" gate, see FIGS. 7-8) and use the dot accumulation wire to load electrons from the doped region into the QD (one could then possibly move the electron to another area on the chip as in the STM induced QD device). Once isolated, the dot gate voltage can be tuned to enhance the quantum capacitance while maintaining single occupation.

Figure 2A:
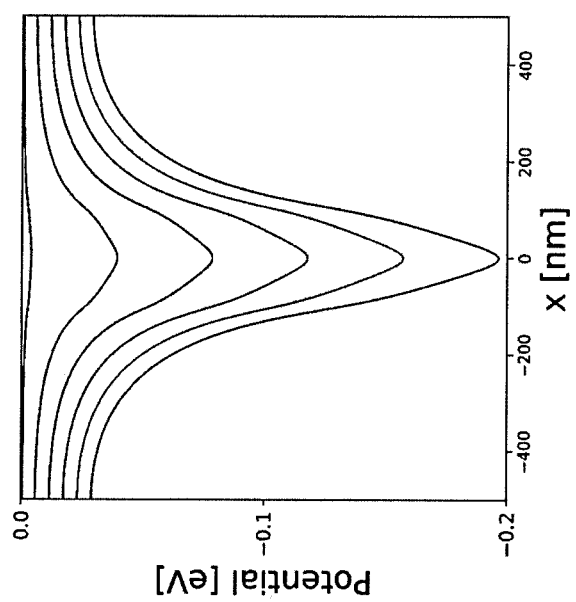
FIGS. 2(a)-2(f) are graphs illustrating performance of system components in a system in accordance with embodiments of the present invention.
Figure 2B:
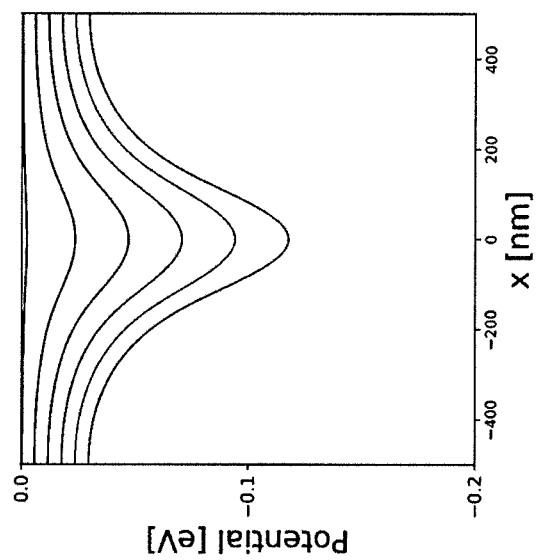
Figure 2C:
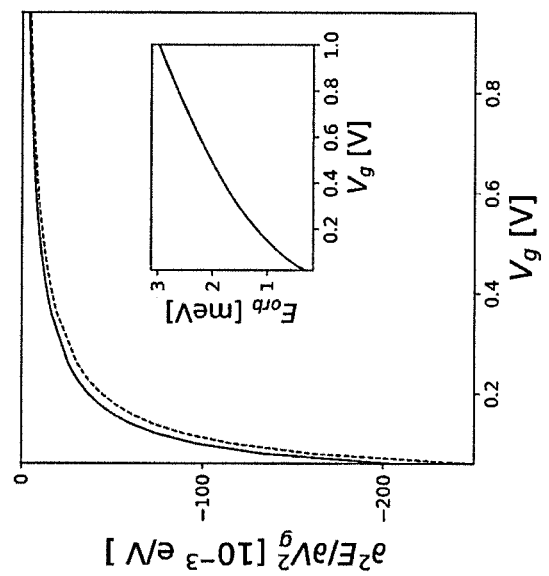

The charge in the QD can be detected via dispersive readout by incorporating a tank-circuit (often superconducting) resonator (typically with a frequency co, of a few hundred megahertz to a few gigahertz) into the gate wire and accumulated QDs [e.g., FIG. 1(a)], and then sending and reflecting resonant microwaves into it. There would be no phase shift of the reflected signal from an empty dot, but if there is a trapped electron, the reflected signal will be phase shifted if the quantum capacitance of the electron energy level is large enough. It is possible to send an rf-signal (along with the DC voltage $V_g$): $V = V_g + V_1 \cos(\omega_r t)$. In addition to the conventional capacitance of the gate-to-heterostructure QD, $C_{MOS}$, and a distributed parasitic capacitance $C_p$ of the gate to the ground plane, as is depicted in FIGS. 1(a) and 1(b), there will be a quantum capacitance $$C_{q,i} = \alpha_c^2 \frac{\partial^2 E_i}{\partial V_g^2}$$

of the induced QD, including the lever arm $$\alpha_c \equiv \frac{C_c}{C_c + C_d}$$

of the tip-to-dot capacitive coupling (here, $C_c$ and $C_d$ are the tip-to-dot and dot-to ground capacitances, respectively; for further estimations, we assume $\alpha_c \sim 1$). The quantum capacitance arises from the non-linear voltage response of the QD's energy levels, $$E_i(V_g) = E_i(V_g^0) + \frac{\partial E_i}{\partial V_g}\delta V_g + \frac{1}{2}\frac{\partial^2 E_i}{\partial V_g^2}\delta V_g^2,$$

assuming slow in time voltage perturbation $\delta V_g$. It leads to a frequency shift of the tank-circuit, and the corresponding phase shift of the reflected signal due to $C_q$ would be $$\Delta \phi \simeq Q \frac{\delta C}{C_{tot}} \equiv Q \frac{C_q}{C_p + C_{MOS} + C_q}, \quad (1)$$

where the Q-factor is defined via the tank-circuit relaxation $\kappa = \omega_r/Q$. For a single QD level, the non-linear voltage response arises from the spatial change of the orbitals, which is often neglected in Hubbard-like Hamiltonians. FIGS. 2(a) and 2(b) show the QD confining potentials at various $V_g$ values for the MOS and QW devices, respectively. The second derivative of the orbital energy levels with respect to the applied $V_g$ is shown in FIG. 2(c) for the MOS and FIG. 2(d) for the QW. The absolute value of the quantum capacitance is larger for a smaller gate voltage $V_g$ and can be as large as $\lesssim 0.03$ aF for the MOS and $\lesssim 0.01$ aF for the QW at $V_g = 0.02$ V, for the geometry discussed herein.

For typical low Q tank-circuits having $C_{tot}$ of a few hundred femtofarads (and a frequency in the few hundred megahertz range), a capacitance change at a level of a few attofarads is measurable, leading to a phase shift $\Delta \phi \simeq 10^{-4}$-$10^{-5}$. FIGS. 2(e) and 2(f) show the calculated phase shift for $C_{tot} = 1000$ fF, vs Q and $V_g$ from Eq. (1)

$$\left(\text{assuming } \frac{\delta C}{C_{tot}} \ll 1/Q\right).$$

The sensitivity to measure a small quantum capacitance will increase for moderately large tank-circuit Q-factors (e.g., the recently proposed high-kinetic inductance nano-wire resonators with a frequency of a few gigahertz, and $Q \approx 10^3$ can be used in the presently-discussed vertical gate circuit. As an example, for $C_q \gtrsim 0.01$ aF as per the simulation, and a reachable resonator parameter: $C_{tot} \approx 30$ fF, $Q \approx 10^3$, one can obtain $\Delta \phi \gtrsim 3 \times 10^{-4}$, which is readily measurable. The lowest detectable $C_q$ may be limited by unwanted variation in the gate-to-QD capacitance as a function of gate voltage (e.g., due to interface traps below the QD gate).

Figure 2D:
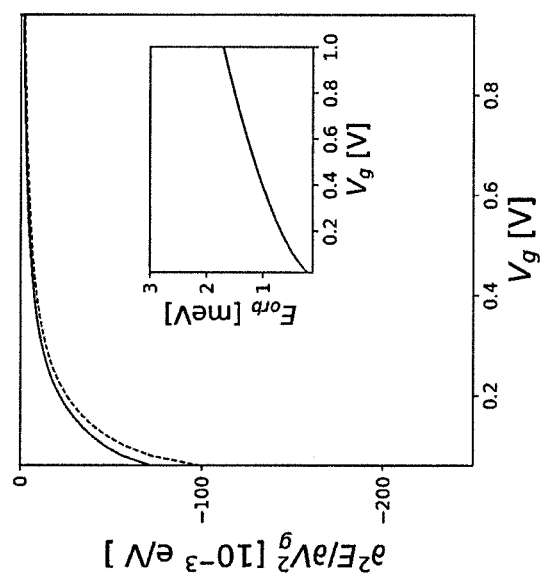
Figure 2E:
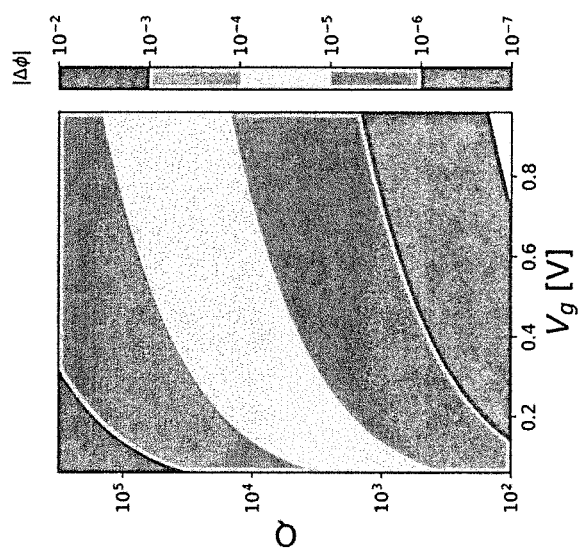
Figure 2F:
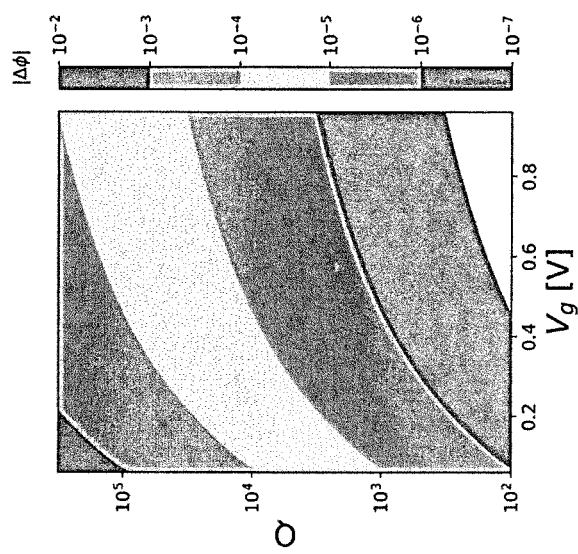

Simulation of the induced QD potential and energy levels' quantum capacitance, $\partial E_i/\partial V_g^2$ is shown in FIGS. 2(a)-2(f). QD potential on a MOS device, for various gate voltages $V_g = 0.02, 0.2, 0.4, 0.6, 0.8,$ and 1.0 V from top to bottom is shown in FIG. 2(a). QD potential of the Si/SiGe QW device, for the same $V_g$ values is shown in FIG. 2(b). The quantum capacitances of the two lowest energy levels of the induced QD for MOS and QW structures are shown in FIGS. 2(c) and 2(d), respectively. The curves indicate the ground and first excited orbitals. Insets show the energy splitting between the two lowest orbitals vs the applied gate voltage $V_g$. FIGS. 2(e) and 2(f) show the calculated phase shift, $\Delta \phi$, of the reflected signal as a function of the voltage $V_g$ and the quality factor Q of the resonator circuit for the MOS and QW devices, respectively, assuming that the induced dot is singly occupied.

If the device is in a configuration where the induced QD is close to an electron reservoir or another quantum dot, then the charge stability diagram can be mapped out directly using the tunneling capacitance, where the response signal peaks at a charge transition.

As an example of critical material parameters that the separate gate chip could measure, we now discuss how to measure the valley splitting in a silicon wafer. We first examine the case of a single QD with one electron. A relatively small accumulation mode QD can ensure that the orbital splitting is much larger than the valley splitting, $E_{orb} \gg E_{VS}$, which allows us to consider only the lowest orbital states in the following analysis. Experimentally, $E_{VS} = 300$-$800$ µeV and $E_{orb} = 2$-$8$ meV in small QDs in a MOS device and also $E_{VS} = 80$-$100$ µeV and $E_{orb} = 0.5$ meV in another MOS device. For Si/SiGe quantum dots, $E_{VS}$ could be of the order of 80-100 µeV, or it could be much smaller. In the simulation of induced dots, the above is satisfied as $E_{orb}$ is of the order of millielectronvolts [see insets of FIGS. 2(c) and 2(d)].

Figure 3A:
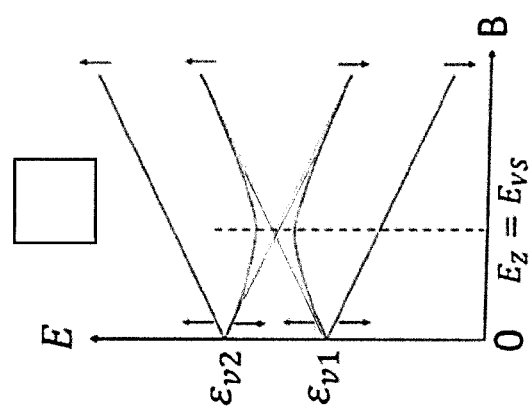
FIGS. 3(a)-3(c) are graphs illustrating valley splitting measurement in accordance with embodiments of the present invention.

The valley splitting, $E_{VS} \propto aV_g$, depends linearly on the applied top gate voltage. By applying an in-plane magnetic field, the lowest two valley states are Zeeman splitting (with energy splitting $E_Z$) into 4 levels, as is shown in FIG. 3(a). Levels 2 and 3 (with different valley content) anti-cross when $E_Z = E_{VS}$, which leads to levels' energy curvature with respect to the gate voltage $V_g$. Indeed, the splitting at anti-crossing, $\Delta_a \propto |r_{v_1,v_2}|E_{VS}(\beta_D-\alpha_R)$, can be phenomenologically parameterized with an (intervalley) dipole matrix element $r_{v1,v2}$, implying a charge re-distribution as a result of interface-induced intervalley tunneling and spin-orbit couplings. We have estimated $\Delta_a=10^{-4}\sim10^{-3}$ $E_{VS}$, using a Rashba/Dresselhaus spin-orbit interactions, $\alpha_R, \beta_D$, induced at the hetero structure interface. Levels 2 and 3 then read: $E_{2,3}(V_g) = \frac{1}{2}\left[E_{VS}(V_g) \mp \sqrt{(E_{VS}(V_q) - E_Z(B))^2 + \Delta_a(V_g)^2}\right].$ This was used to describe the relaxation "hot spot" observed in the experiment, which is mainly due to acoustic phonon emission.

Given this explicit level structure, we calculate the curvature of the levels with respect to the gate voltage $V_g$, obtaining the levels' quantum capacitances, Co (this quantifies the nonlinear response of the QD system). In the magnetic field at anti-crossing [FIG. 3(a)], these quantum capacitances may be strongly enhanced with respect to those of the simple orbitals discussed above. The ground state has zero curvature ($C_{q,1}=0$) from this effect, while for levels 2 and 3, one gets Cq,2=−Cq,3, and $$C_{q,3} \simeq \frac{a^2}{2\Delta_a} \Big/ \left[\left(\frac{E_{VS}-E_Z}{\Delta_a}\right)^2 + 1\right]^{\frac{3}{2}}, \quad (2)$$

with the capacitances sharply peaked near the anti-crossing (using a simple model with a linear dependence on $V_g$ for the valley splitting). With the experimentally estimated $\Delta_a$ and the valley splitting slope, $a_{exp} \approx 0.64$ meV/V, we obtain (for $E_{VS}=100$ μeV) $|C_{q,2,3}| \approx 0.3$-3 aF, which should be measurable in experiments. Another capacitance contribution may appear due to fast relaxation processes. While the relaxation rate $\Gamma_{rel}$ strongly increases at the spin-valley anti-crossing for a single electron QD (reaching $10^7$-$10^8$ s$^{-1}$), it is much slower than the chosen tank-circuit frequencies, $\Gamma_{rel} \ll \omega_r$, thus suppressing this capacitance contribution. A way to enhance $|C_{q,2,3}|$ is to use the in-plane magnetic field with an angle such that $\Delta_a$ becomes much smaller; however, making $\Delta_a$ smaller will narrow the region where $C_q$ is significantly nonzero.

By scanning (sweeping) the magnetic field in the single electron, single quantum dot case, we will register a sharp peak of phase change of the reflected signal when the Zeeman splitting is $E_Z=E_{VS}$. For this to work, we need to populate the excited states by choosing a temperature comparable to the valley splitting, e.g., for $E_{VS}=100$ μeV, the temperature should be T≈1K. Since $E_{VS} \gg \Delta_a$, the populations of levels 2 and 3 in FIG. 3(a) will be comparable, thus leading to an effective quantum capacitance suppression by $\Delta_a/kT \sim \Delta_a/E_{VS} \sim 10^{-3}$.

Figure 3B:
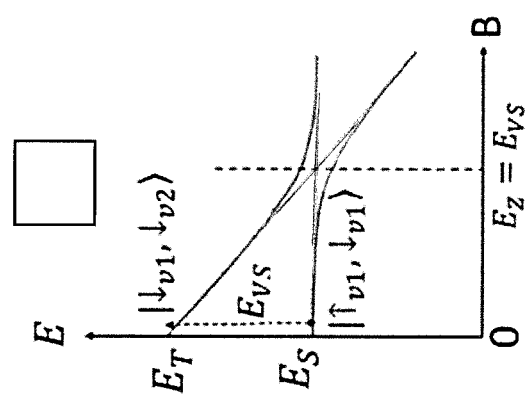

A way to mitigate these effects would be to use a single QD with two electrons. As shown in FIG. 3(b), the lowest two levels now anticross at $E_Z=E_{VS}$ with an anti-crossing splitting $\Delta_a^{2e} \approx \Delta_a$, and the quantum capacitance is the same as in the 1-electron case, while the relaxation is strongly suppressed at anti-crossing. Also, the suppression effect due to temperature will not be as strong as in the 1-electron case, since kT~$\omega_r$ ≲1 GHz and so $\Delta_a/kT \sim \Delta_{10}/\omega_r \sim 10^{-1}$-$10^{-2}$. However, since we are in a regime $\omega_r \gg \Delta_a$ (opposite to that where a quantum capacitance approximation is valid), the effective quantum capacitance is suppressed by a form factor:

$$C_{q,\text{eff}} \simeq C_q\left(\frac{\Delta_a}{\omega_r}\right)^2.$$

For example, for $E_{VS} \lesssim 100$ μeV, the suppression factor is $$\left(\frac{\Delta_a}{\omega_r}\right)^2 \approx 1/40^2.$$

Thus, this method would be sufficient to measure not too small valley splitting.

Figure 3C:
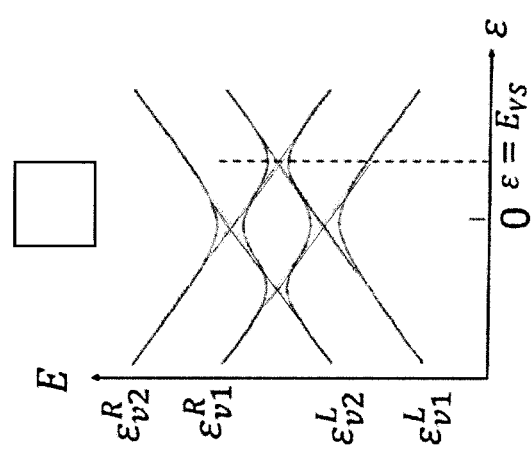

An alternative technique to measure the valley splitting with a slightly more complicated gate circuit is to induce a double QD using two or three gate wires on the gate chip. Let us consider a DQD with a single electron, assuming each QD has the same valley splitting. The detuning between the QDs can be changed by tuning the voltages on the two QD-defining gates. At zero detuning (ε=0), one is at the degeneracy point of the lower eigenvalley v1-electrons. [v1 is the lower valley and v2 is the upper valley state. See FIG. 3(c)]. The left-right tunneling t between the dots defines the splitting at anti-crossing, 2t. One can then measure the change in the reflected signal at the degeneracy point (where the energy curvature is maximal) using a tank circuit frequency $\omega_r \ll 2t$. By sweeping the detuning to ε=$E_{VS}$, the v1-electron from the left can tunnel to the v2-level from the right. This tunneling possibility forms another anti-crossing and the corresponding splitting (assuming the same 2t).

To measure the valley splitting, one starts at ε=0 and populates the lowest two levels by temperature. One then moves (faster than the relaxation time $T_1$) to a detuning ε=$E_{VS}$, while sending a microwave with $\omega_r \ll 2t$, to encounter a sharp change in the reflected phase (provided that t$\ll E_{VS}$). This can be fulfilled for 2t≈2-4 GHz and $\omega_r \approx 0.5$-1 GHz. Once ε=$E_{VS}$ is reached, the reflected signal changes accordingly, due to the maximal quantum capacitance $C_q=e^2/2t$. The quantum capacitance at this anti-crossing is estimated of the order of 10 fF, which is several orders of magnitude larger than at the spin-valley anti-crossing discussed above. In order to be able to distinguish the anti-crossings at ε=0 and at ε=$E_{VS}$, one needs $E_{VS} \gtrsim 2t$ which sets the lowest measurable valley splitting, $E_{VS} \gtrsim 5$-10 μeV. Notably, the probing signal is far off resonance with the level splitting, at a constant tank-circuit frequency $\omega_r \ll 2t$, and the signature of valley splitting is easier to measure.

An additional (tunable) microwave field can be introduced to the configurations described above to drive transitions between quantum dot states, which may allow for further or improved characterization (and also introduces another absolute energy scale to compare to, in addition to the magnetic field).

The techniques described herein require a sensitive measurement of small (quantum) capacitance changes, $C_q$, in the sub-attofarad to attofarad range. The signal due to $C_q$ may be obscured, however, in the presence of noise of large fluctuating capacitances, $C_{MOS}$, $C_p$ (see FIG. 1). For example, fluctuations via the voltage dependence of $C_{MOS}$ ($V_g$) are attributed to the charging of interface traps below the QD gate; the corresponding noise variation would be $$\Delta C_{MOS}^{noise} = \left|\frac{\partial C_{MOS}}{\partial V_g}\right|\sqrt{\frac{S_V}{2t_{av}}},$$

where $S_V$ is the voltage spectral density and $t_{av}$ is the averaging time. It was experimentally shown that below a sample-specific voltage threshold, $V_g < V_{th}$, the capacitance derivative was small, and a capacitance change of $\approx 1.5$ aF was resolved. Another type of noise may enter through mechanical fluctuations of the tip. In an experiment of near-field SMM, the (slow) resonator frequency fluctuations are tracked and stabilized via a feedback loop allowing a longer averaging time to reduce the noise; a sensitivity of $(0.06 \text{ aF})^2$/Hz was limited by mechanical noise. Since in accordance with the presently-disclosed embodiments the tip does not move, the mechanical noise may be reduced, eventually allowing for valley splitting measurement via a tip-induced QD in the Si hetero structure.

Inducing quantum dots instead of fabricating them enables nondestructive characterization either locally or across a wafer, speeding the optimization of materials and quantum devices such as qubits. These techniques are applicable to other materials and systems as the inducing and measurement chips can be fabricated on a substrate different from the materials system under consideration. Induced QD devices and the actual quantum devices built on the wafer will be different, but they share many critical aspects of the underlying material. Characterization of the induced QD devices will provide useful information of the yet-to-be-built devices. Implementations of these disclosed embodiments enable further experimentation and design using other materials and systems (germanium, holes instead of electrons, topological systems, etc.) and qubit approaches (encoded qubits, different readout techniques, and even linear arrays of qubits making small quantum computers) without the need to actually fabricate the quantum dots themselves.

Embodiments of the present invention allow for separating the qubit realization and testing circuitry from the materials science and on-chip fabrication that would ultimately be desired in a manufacturing process. This approach allows, in the shorter term, characterizing wafers non-invasively for their qubit-relevant properties, to make small qubit systems on various different materials with little extra cost, and even to test spin-qubit to superconducting cavity entanglement protocols where the best possible cavity quality is preserved. Such a testbed can advance the materials science of semiconductor quantum information devices and even enable small quantum computers.

A qubit can be realized in the spin of an electron, where the two levels can be taken as spin up and spin down. A single electron can be trapped in a semiconductor box, called a quantum dot. In silicon—currently the most promising material for spin qubit quantum computing—the indirect band-gap means that the electron has extra nearby levels, combinations of the conduction band minima or "valleys" where the electron exists. Temperature and noise can cause unwanted excitation into these states if they are too close in energy.

This so-called "valley splitting" problem, especially in silicon-germanium quantum dots, impacts yield, initialization/readout, and quantum operation fidelity. Although somewhat obscure, this materials science issue is a roadblock to quantum information processors in silicon; and valley splitting is only representative of a greater challenge.

Like for other critical qubit parameters such as coherence time, to measure the valley splitting one must fabricate a quantum dot and test it, typically at dilution refrigerator temperatures (milli-Kelvin or about fifty times colder than deep space). The general difficulty in making qubits in semiconductors has hampered progress in the field. Exciting recent success—dot qubits that function and compelling quantum gate demonstrations—has taught us a lot about how to make good qubits. Yet there is a high barrier to entry for new experimental groups compared to, say, superconducting qubits.

The transmon qubit, which itself is robust by design (meaning if you make them, they typically work—they are still quite delicate), can be fabricated with essentially a single layer of metal, at huge length scales if wanted, and can be characterized and controlled with a single microwave cavity/generator/line or even wirelessly, via a properly designed superconducting cavity. Superconducting circuits can be floating, requiring no source or sink of carriers. In contrast, using what we know now as best principles for making a silicon quantum dot qubit, one needs to make very small dots (due to large effective mass), with preferably overlapping gates to limit cross-capacitance between dot gates and to increase yield due to disorder, all with order of 10 nm wire-widths at ≤100 nm wire pitch. Note that "gates" is used in two ways. First, there are quantum gates or operations, these are logical operations on the qubit. Second, in reference to physical metal wires, or gates, with some voltage potential, a terminology that comes from the semiconductor transistor community. The materials stack (affecting leakage between the top gates and electrons, disorder, etc.) can be critically important to whether the quantum dots you want can even be formed where you want them, let alone will they function or have desirable qubit properties (low error rates). Spin quantum dot qubits also need multiple physical wires per dot, in addition to nearby charge sensors, for spin-charge-based readout. This level of complexity in fabrication—which must be coupled with good materials science properties of the wafer and the gate stack—retards both new qubit exploration and characterizing many, individual quantum dots to optimize materials science parameters.

We can separate the materials science challenge from the "making the dots and measure them" challenge. If the dots and associated readout circuitry can be made on another circuit chip or board, then the actual electron (hole)-hosting wafer can be optimized separately (and even of different crystals such as germanium). The idea of "flip-chip" engineering has already been applied in the superconducting context, while the concept of a "probe" trap has been used in ion trap quantum computing to search for heating mechanisms on relevant surfaces. Embodiments of the present invention enable a new kind of testbed where dots are induced on a separate chip to characterize materials and to see if the protocols we design for qubit operation work. In doing so, an acceleration of progress similar to that driven by the "wireless" 3D transmon concept could be replicated in the spin community.

A spin qubit is formed from the Zeeman split sub-levels of the ground state of an electron trapped in some potential inside a semiconductor. That electrostatic potential can be artificial, formed from the combination of a heterostructure and an external voltage, or natural, the pull of an implanted donor. One or more electrons or holes can be placed in a dot to form a single qubit or a qubit can be "encoded" into the large Hilbert space of multiple separate quantum dots, and each approach has different potentially useful properties for quantum computing. The notion of encoded qubits is not exclusive to spins, but it is especially important here for three reasons: 1) spins are small, so microwave gates can result in a lot of cross talk, 2) microwave gates are slow, 3) two qubit gates via the exchange interaction are fast. Typically, we focus on 1 or 3 electrons per dot in a roughly parabolic potential in the plane of the two-dimensional electron gas (2 DEG) or inversion layer, where the potential must be deep enough such that the envelope function orbital levels ("p-like") are well above the energy of thermal excitations (~kT). Odd numbers of electrons keeps the spin ½, but also lowers the excited energy levels which can cause complications in gates. Effective mass theory lets us throw many of the complexities of actually being in a crystal under the rug and bundle that up in a new mass. For indirect band-gap conduction bands, or valence bands (holes, which can be considered spin-3/2), there can be other nearer levels than the orbital levels which one may also need to worry about. Somewhat surprisingly, the spin splitting can be smaller than the effective temperature, and typically is during quantum operations. Kramers degeneracy (where effectively a "forbidden" very tiny matrix element connects phonons between the two spin states) results in extremely long lifetimes for spins in some solids, a fact that has been known at least since the 1950s.

In designing a quantum computer based on quantum dots we care about a number of intrinsic parameters derived from the quantum dot potential, material and material stack, and the proximity of other qubits/defects/oxides/gates, and still other parameters that are more relevant for two qubit operations. These include the level structure of the dot (or spectroscopy of the excited states), the spontaneous decay time (called the $T_1$ time, almost always due to phonon emission at these dilution refrigerator temperatures, but more complicated above ~1K), and the decay of the coherence of the qubit as a function of time (or $T_2^*$ for the specific 1/e time assuming an exponential fall-off, which is actually not usually the case). All these parameters can change with the number of particles per dot and if multiple dots are coupled together, either via the Pauli exchange interaction or capacitively (more on this below).

Figure 4A:
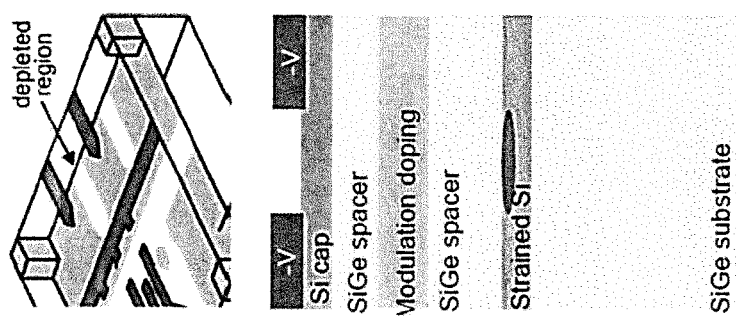
FIGS. 4(a)-(c) are diagrams illustrating physical geometry of prior art quantum dot systems.
Figure 4B:
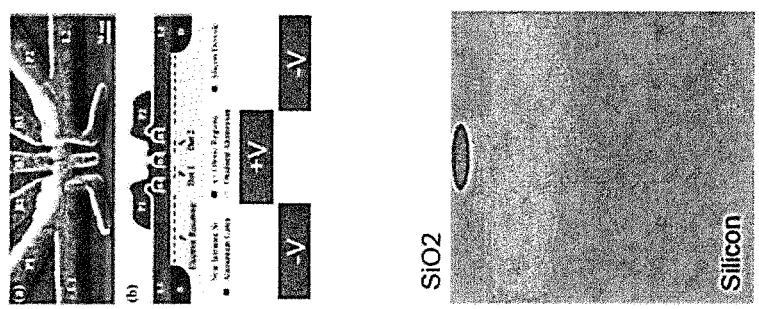
Figure 4C:
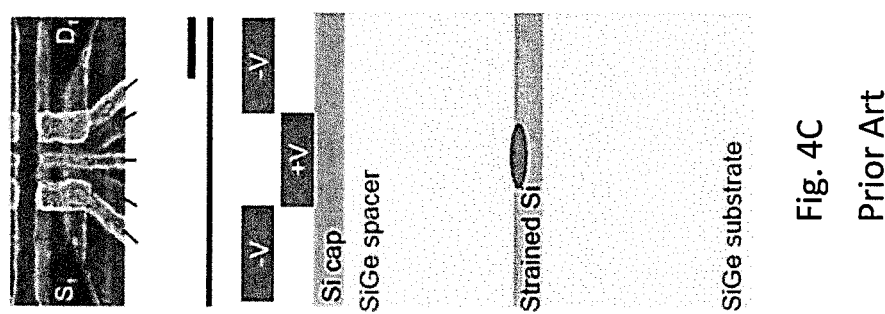

Prior art approaches to quantum dots are shown in FIGS. 4(a)-4(c). FIG. 4(a) shows an early depletion mode quantum dot utilizing doping layers (modulation doping) and negatively charged metal top gates to push away all electrons but one. These suffered from severe disorder when implemented in silicon. FIG. 4(b) shows an accumulation mode device using overlapping gates to form dot and tunnel gates. Often a nearby charge sensor (also a dot) is used for spin-charge readout. Here, the doping layer can be removed if implanted electron "sources" are nearby. FIG. 4(c) shows a single quantum dot potential in its simplest form.

Figure 5:
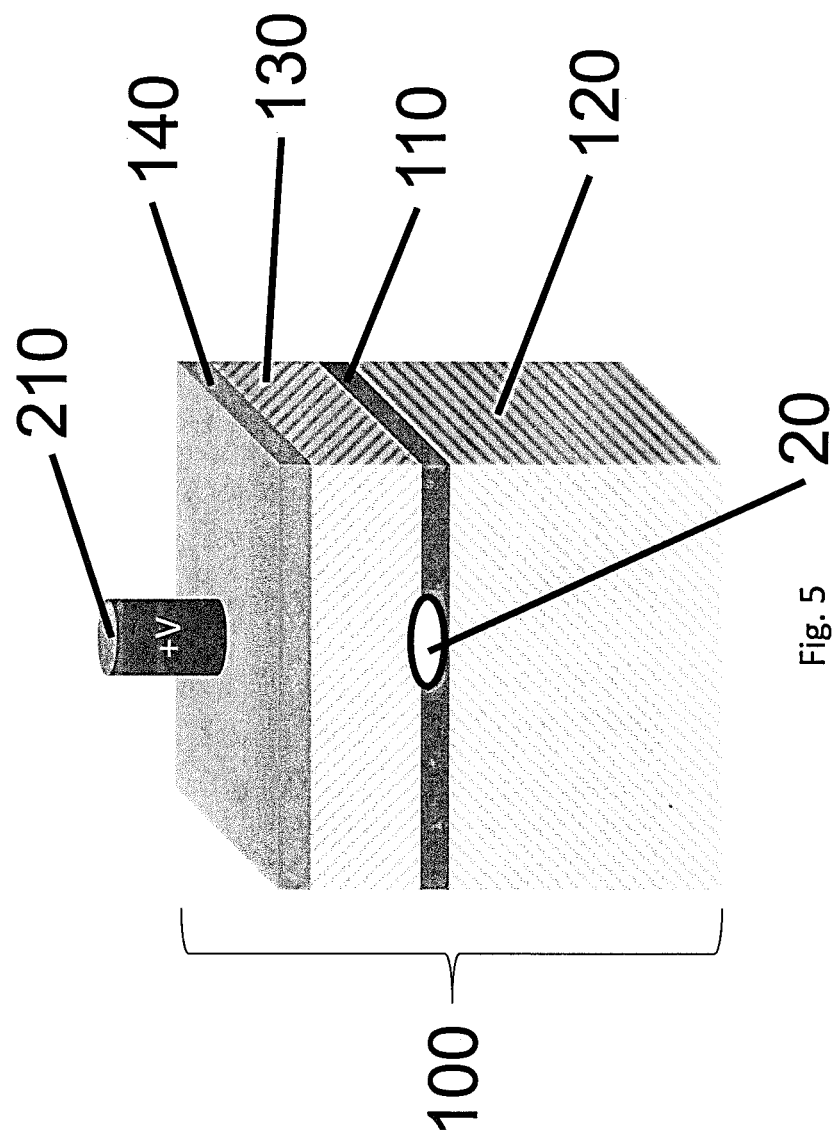
FIG. 5 is a diagram illustrating physical geometry of a quantum dot system in accordance with an embodiment of the present invention.
Figure 12:
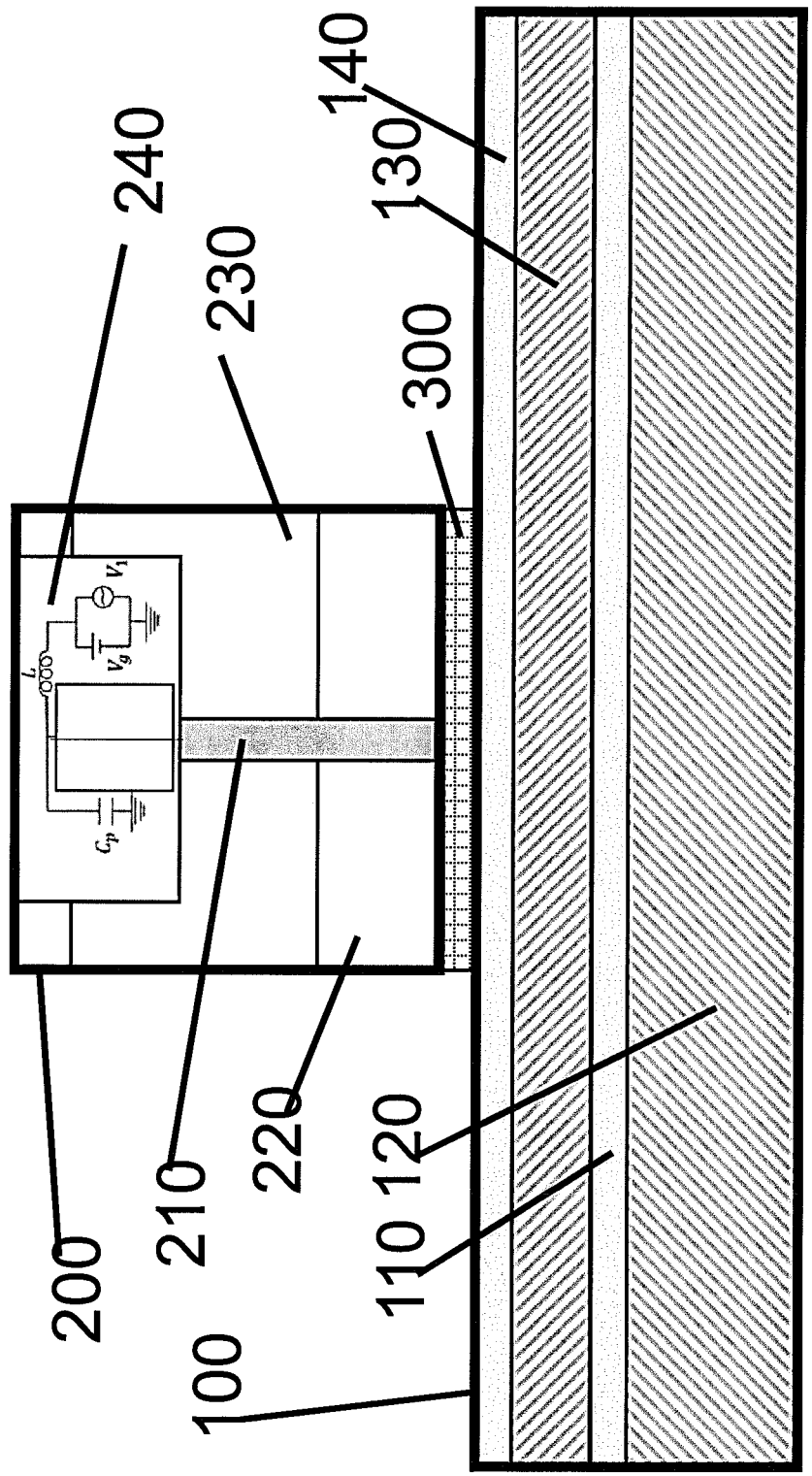
FIG. 12 is a diagram illustrating physical geometry of a quantum dot system in accordance with an embodiment of the present invention.

A system for a quantum dot in accordance with an embodiment of the present invention is now described with reference to FIGS. 5 and 12. A charge carrier such as an electron or hole whose spin states form a quantum dot qubit 20 is created with the gate wire(s) 210 on a separate upright chip 200 perpendicular to the wafer quantum-well chip, an up-chip (like a flip-chip). A semiconductor heterostructure 100 comprises a surface layer 140, a barrier layer 130, and a subsurface layer 110 (a quantum well or inversion layer which traps charge carriers—electrons or holes—in a growth direction of the heterostructure wafer). The heterostructure 100 also comprises a substrate 120. The gate chip 200 may optionally be separated from the heterostructure 100 by a gap 300, which may be on the order of 10 nm or less. The gate chip can include gate chip circuitry 240 to perform detection, characterization, and measurement functions. The gate chip also comprises substrate regions 220 and 230. Substrate region 220 may be a vacuum in some embodiments.

Creation of a quantum dot is now described in accordance with an embodiment of the present invention. In some embodiments, semiconductors may be used such as GaAs, silicon, germanium. GaAs has spinful nuclei, leading to poor $T_2^*$ times (—ns). We may create an electrostatic trap for the electron in z by making either a "quantum well" or an inversion layer. For the former, use a SiGe—Si—SiGe sandwich. For the latter, use an oxide-silicon interface of silicon and silicon-dioxide. An accumulation gate (positive voltage) creates a triangular-like potential, pulling electrons (if available) up the surface. In either case there are no electrons until we put them there (assuming no doping). The effective mass of electrons in silicon is relatively high, meaning that to get an orbital splitting of ~1 meV=10K, we need an effective "box" of ~30 nm. Finally, a combination of negative (depletion) and positive (accumulation) gates can form the trap in the (x,y) plane creating our dot potential. Because of the large effective mass, the community has learned that unwanted "dots" (think a disordered eggshell container) can form in the quantum well via the presence of donors, or by possibly tiny strain due to metallic gates on the surface. Therefore, don't dope the quantum well; implant donors somewhere else. And make the gates as uniform ("total coverage") and as far away as possible. This is how the best arrays of lateral quantum dots for qubits are fabricated today.

All we really need to induce a dot potential, however, is a single wire with a positive potential with the appropriate geometry and distance from the target active layer. This can be formed from a metal gate on the dot wafer surface, or by a wire on a different chip or probe tip. Indeed, Scanning Tunneling Microscope (STM) tips have been used in the past to induce dots. The inventors have appreciated that it would be advantageous to make the dot gates on a separate chip. Thus, the simplest dot we can imagine actually doesn't require fabricating a dot on the "dot chip" at all. We can fabricate the "dot inducing chip" on a separate substrate, with a single layer of metal. We can then place that perpendicular to the "wafer chip" (touching or not) to where the dot is actually intended to be created. All the circuitry we need to measure the dot can be off the dot chip.

But where do the electrons come from? In some embodiments, from the bulk by, for example, shining light on the wafer (this was done in the earlier days of modulation-doped quantum wells to ensure that the well was populated or to increase density and is also common practice in STM experiments. Light background doping and a doped back gate reservoir may be used. Generate enough carriers and our dot will trap one (or more, depending on the depth of its trapping potential). In other embodiments, we can move the gate tip to an implanted region on the wafer, and physically move the loaded dot away from it to isolate the dot. In other embodiments, we add another lead to the upright-chip, a much wider and fatter "bath" gate that can bring electrons into the channel from the implanted region to the dot much like is already done. Implanting is a standard procedure and requires a mask but can be outsourced, and leaves the wafer implanted.

Figure 6:
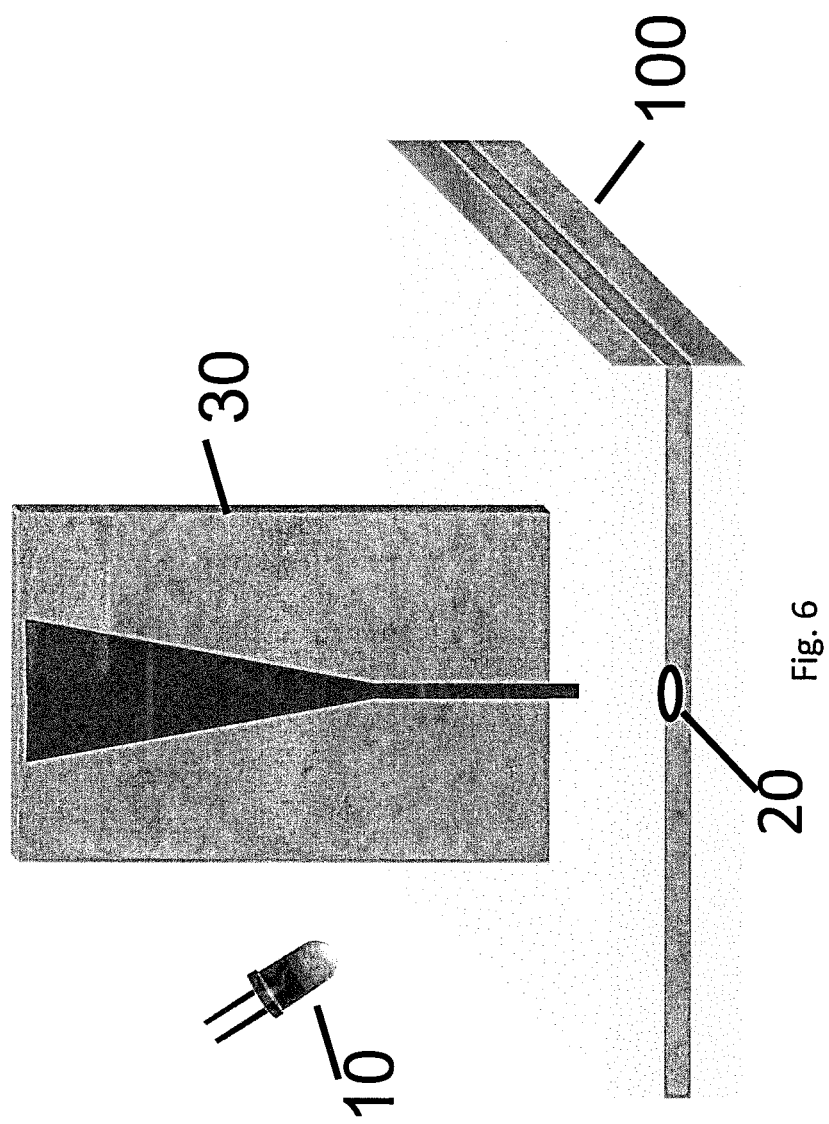
FIGS. 6-8 are diagrams illustrating loading of an electron into an induced quantum dot in accordance with an embodiment of the present invention.
Figure 7:
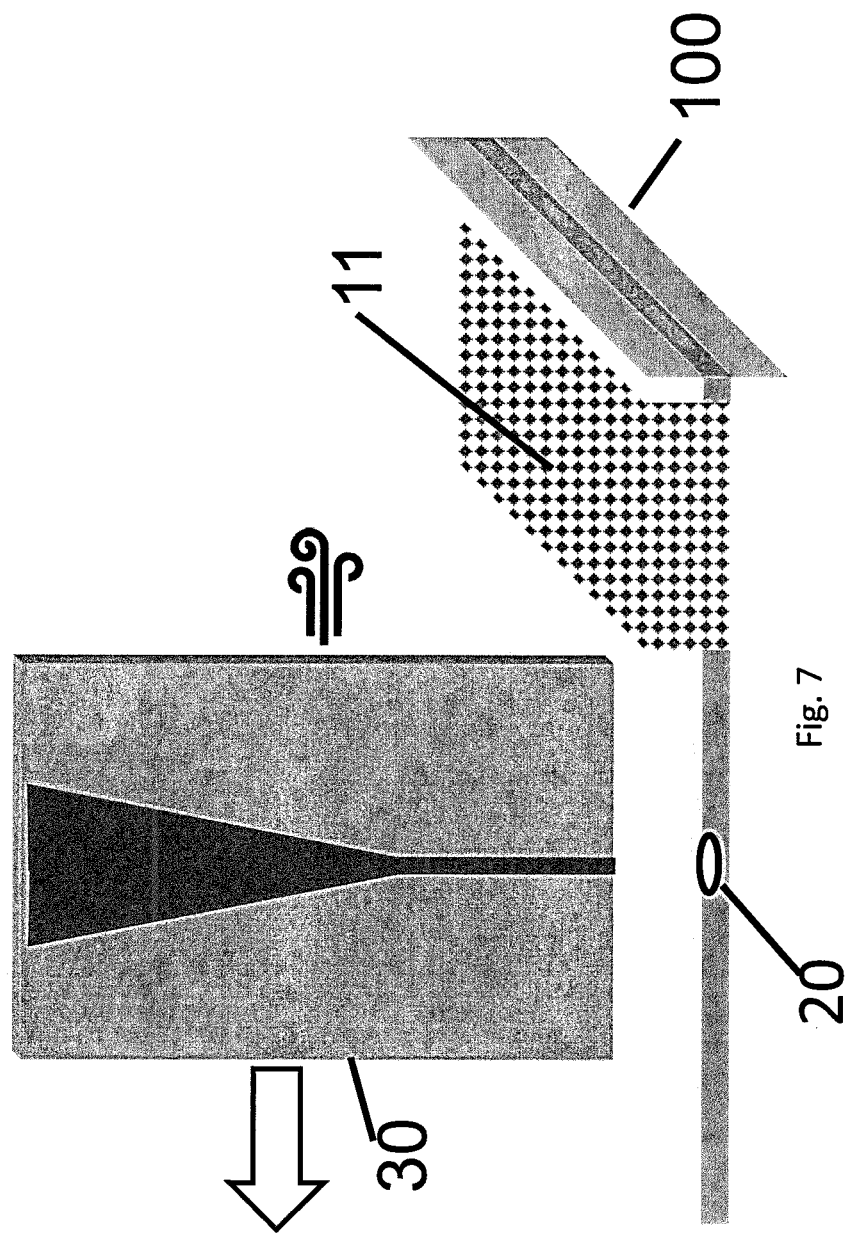
Figure 8:
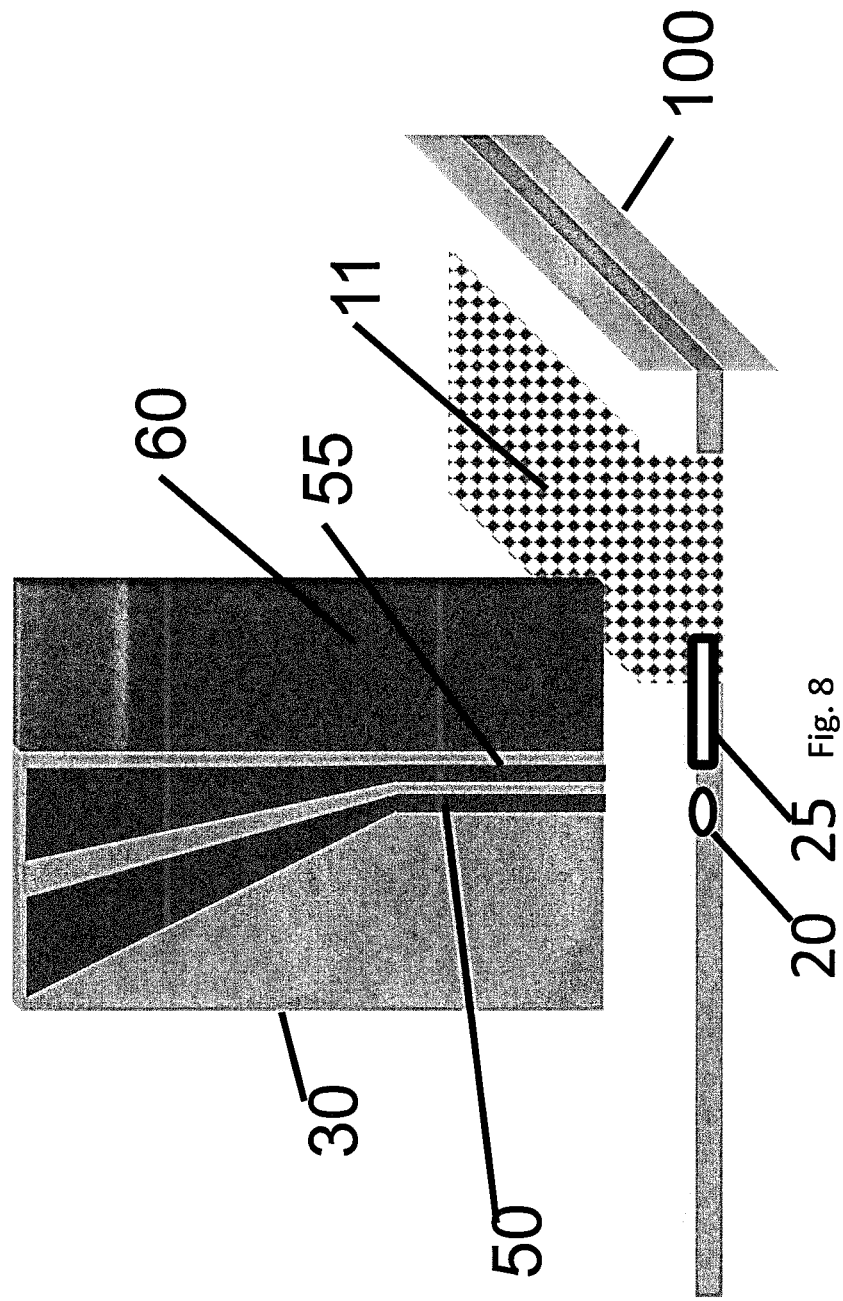

Loading of a charge carrier into an induced quantum dot in accordance with embodiments of the present invention is now described with reference to FIGS. 6-8. Gate chip 30 has a single lead wire with a voltage potential to induce an electrostatic potential in a subsurface region of heterostructure 100. In the embodiment shown in FIG. 6, an electron is loaded into an induced quantum dot by creation of charge carriers 20 (electron and hole pairs) via light 10. Subsequently, the hole is pushed away while the electron is trapped due to the applied positive voltage on the lead wire. In the embodiment shown in FIG. 7, ohmic regions of doped atoms 11 provide the electrons. The gate chip 30 is then moved across the surface of the heterostructure 100 to a location where the ohmic regions of doped atoms 11 will not affect qubit performance. In the embodiment shown in FIG. 8, an electron qubit is loaded via an additional bath gate 60 on gate chip 30 from a nearby heavily doped region 11 within the semiconductor heterostructure 100. In this embodiment, a region 25 of charge carriers with more than one electron or hole provide a nearby source of electrons for quantum dot potential. The gate chip 30 includes a gate chip quantum dot wire 50 to induce quantum dot potential, a gate chip tunnel gate wire 55 to create electrostatic potential between the induced quantum dot qubit and the bath region, and the gate chip bath gate wire 60 to induce the region of multiple charge carriers (i.e., a "bath" of electrons or holes).

Figure 9:
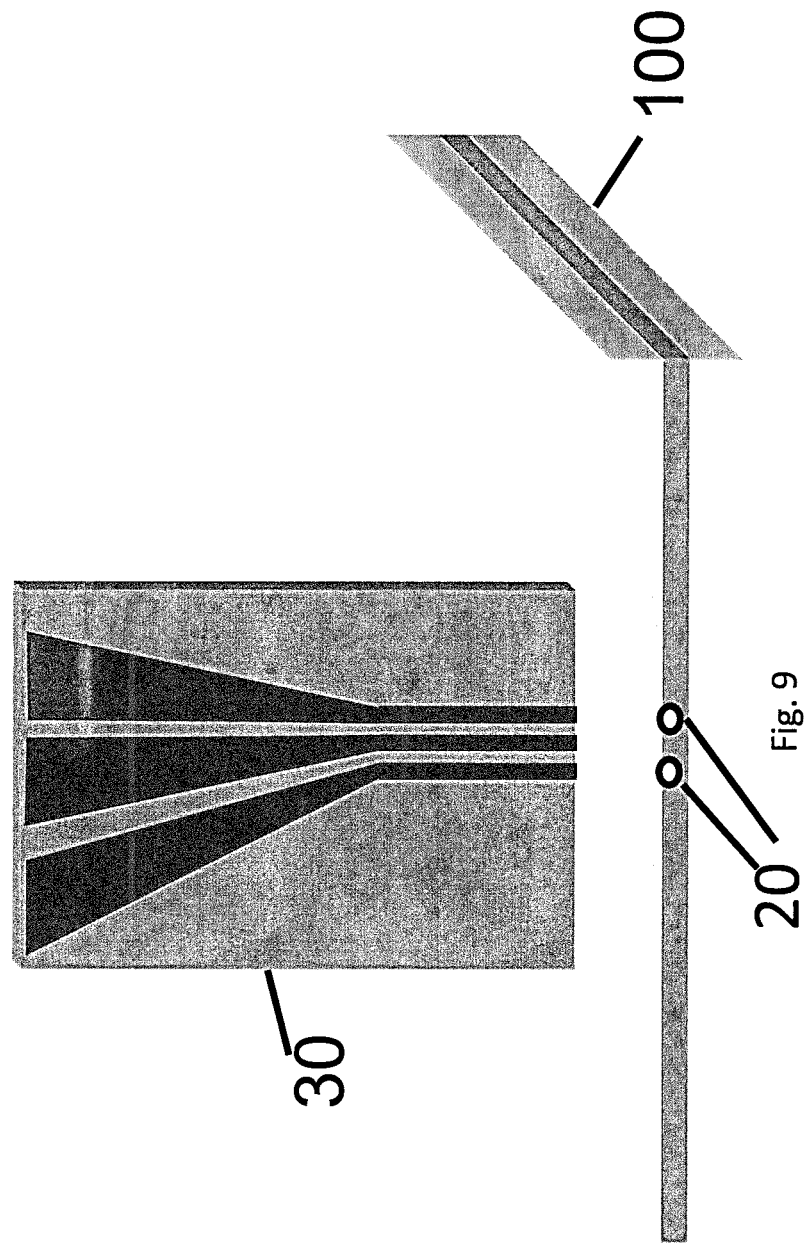
FIG. 9 is a diagram illustrating a multiple quantum dot system in accordance with an embodiment of the present invention.

FIG. 9 illustrates another embodiment. Gate chip 30 here has three lead wires. These lead wires have induced two quantum dots 20 in the subsurface layer of the heterostructure 100.

The above-described operations can induce a quantum dot potential and load it with an electron. Thereafter, it is important to confirm that an electron qubit is present. If the dot is truly isolated, this is a challenging task. Best practice for qubit measurement or readout is to create a nearby (in a second row parallel to the array of dots) quantum dot charge sensor, tuned to the edge of a Coulomb blockade peak for maximum sensitivity. This can be vastly more sensitive than measuring the transport through the dot. However, the technique most applicable to our situation—a single wire or linear array of wires—is dispersive readout, where, typically, a tank circuit is attached to a nearby dot gate, and small changes in the quantum capacitance (or more generally the curvature coupling) of the system are detected by measuring the phase shift (dispersive shift) of the resonator via of an rf-pulse at the resonator frequency. But note that this technique as applied so far has only worked in two ways: one, detecting a signal when electrons tunnel in and out of a nearby bath (so-called "tunneling" capacitance of Zalba) or two, at a charge transition to a nearby dot (where the quantum capacitance is detected, the curvature of the two-dot, one-electron system is maximal at the degeneracy point, the symmetric state of a charge qubit). Thus if this condition is met, standard techniques can be applied to map out 0, 1; . . . electrons in the dot. A higher-frequency resonator can also be used. We have shown that the energy band curvature due to a single, stationary electron may be measured, as compared to no signal (no electron trapped). Assuming the use of a superconducting resonator in series with the dot-inducing gate, quantum capacitances as low as below an attofarad should be observable with reachable resonator Q values, allowing for the detection of electrons without tunneling transitions to a reservoir or dot. If the measurement apparatus is fast enough then the appearance of an electron from the bulk (due to light for example) may be observable. If these don't work, then using the bath gate or a nearby dot (a 2 dot probe) will be necessary, slightly complicating the approach but making all the known techniques for qubit characterization available.

With a single wire and corresponding superconducting cavity, we can detect if there is an electron in the dot and measure the valley splitting given some rather stringent assumptions. Doing precise spectroscopy requires a relative energy scale. The magnetic field provides that reference, provided it can be well calibrated. Another option is to introduce another RF field which drives transitions in the dot. Unfortunately given the large possible range of valley splittings and possibility of very large orbital splitting (up to 8 meV or more), tunability of the microwave field would have to be over a vast range. With two dots, a new energy scale emerges—the detuning between the two dots—there are many more options.

Figure 10:
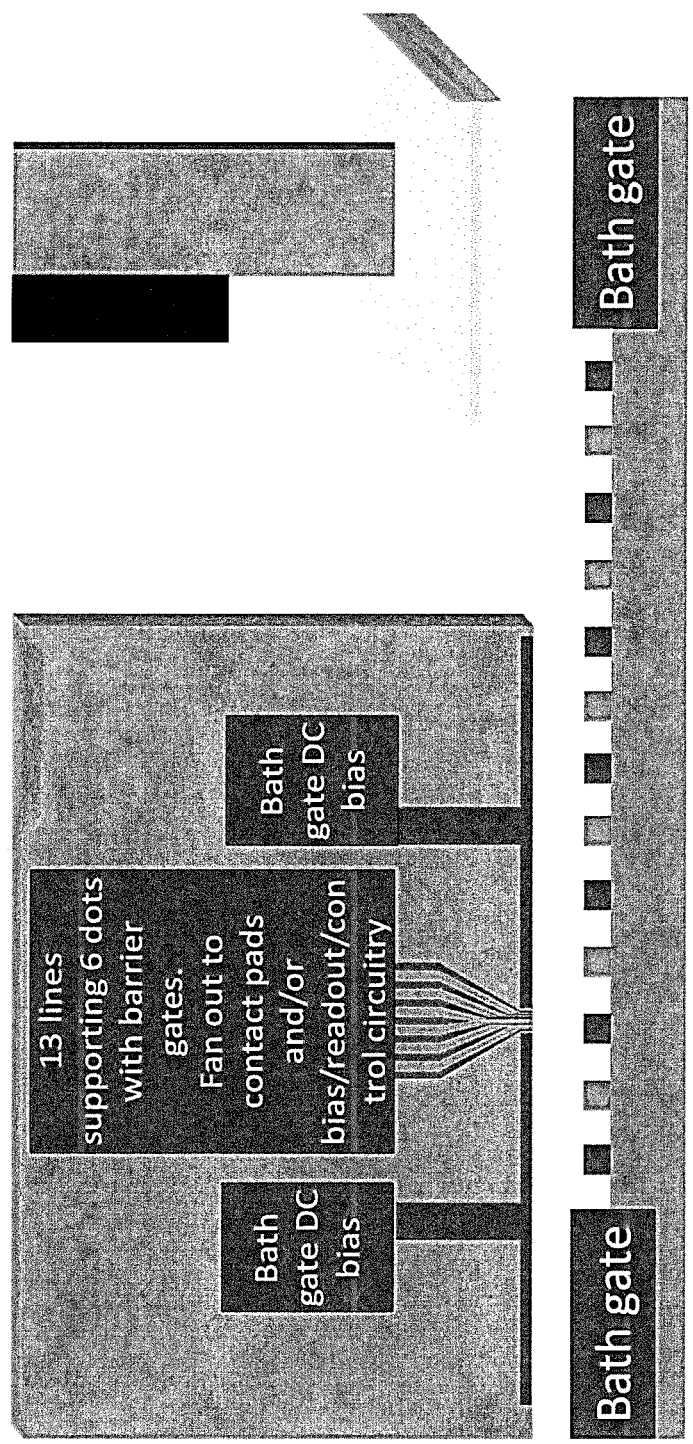
FIG. 10 is a diagram illustrating a linear array of induced quantum dots in accordance with an embodiment of the present invention.
Figure 13:
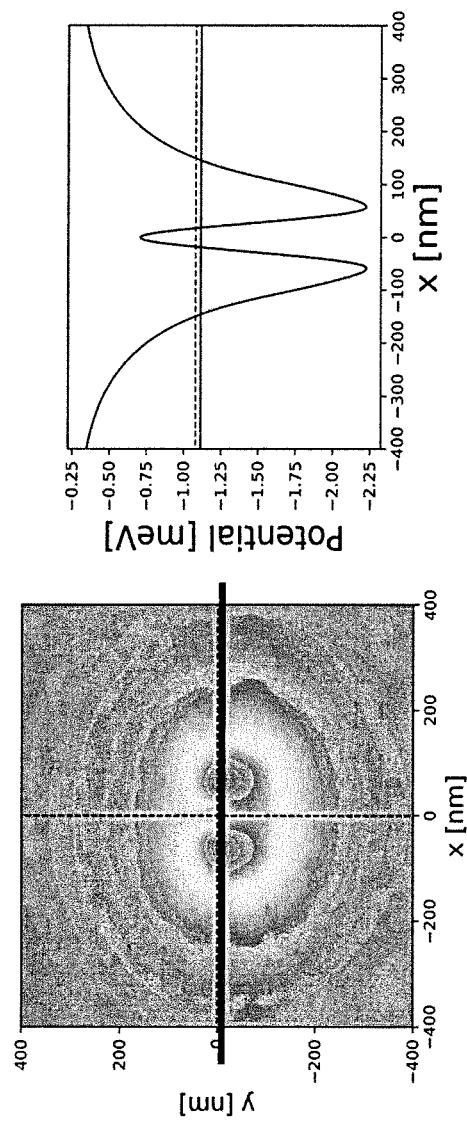
FIGS. 13 and 14 are diagrams illustrating the results of a three lead wire gate chip simulation inducing two quantum dots in accordance with an embodiment of the present invention.
Figure 14:
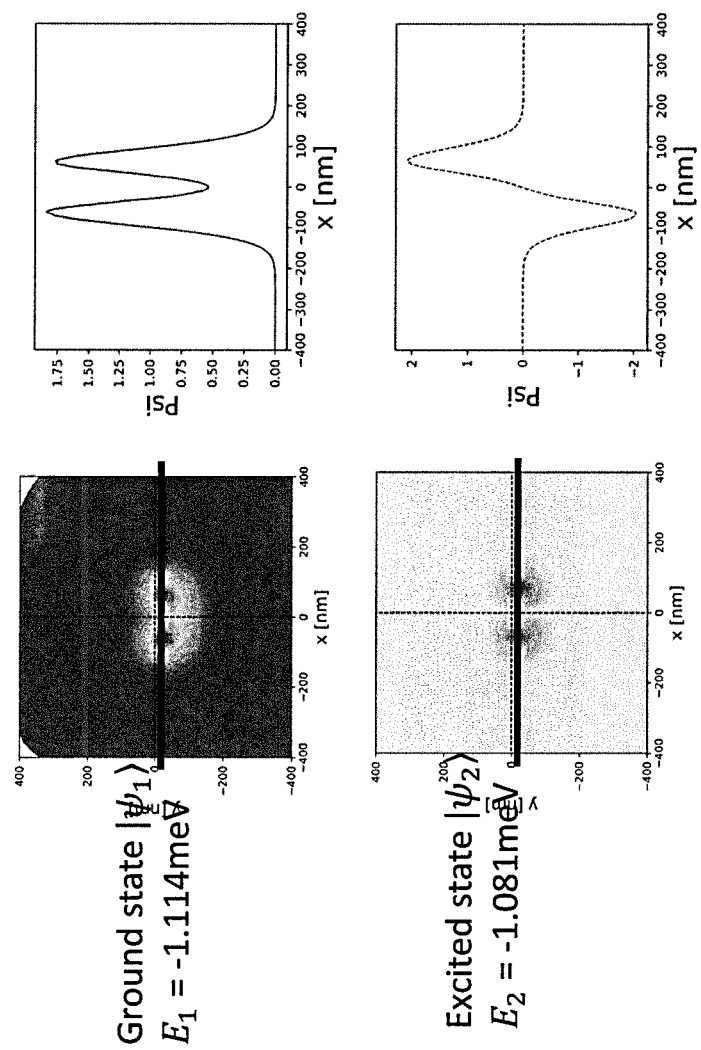

Multiple quantum dots can be induced in a linear array with a multiple lead wire gate chip. The results of a three lead wire gate chip (FIG. 9) simulation inducing two quantum dots with a tunable inter-dot barrier potential are shown in FIGS. 13 and 14. An illustration of such a six dot device is given in FIG. 10. While it is possible to make two dots with just two wires, and for many years the community relied on detuning of energy levels between dots to perform exchange, now it is understood that using the barrier gate is better. It allows for operation at a sweet spot (symmetric operating point) and it is less sensitive to charge noise than the plunger gates above the dots (that is, exchange is less sensitive to the tunnel barrier than to the detuning, so charge noise is minimized by using only high speed lines on the barrier if possible). Doing so allows one to measure dot qubit quantum properties such as coherence times and even do quantum operations, that is, make a small quantum computer. The caveat is charge sensors couldn't be in a separate plane—so can we can use dispersive readout or longitudinal readout, etc, not necessarily a limitation when SC amplifiers are included for small numbers of qubits. This gate chip can be applied to other wafers. For materials that have charge carriers with an effective mass smaller than silicon electrons (such as germanium holes and indeed most known relevant materials for quantum computing), the calculation simulation parameters presented here will result in a gate chip that induced quantum dots suitable for quantum computing.

Figure 11:
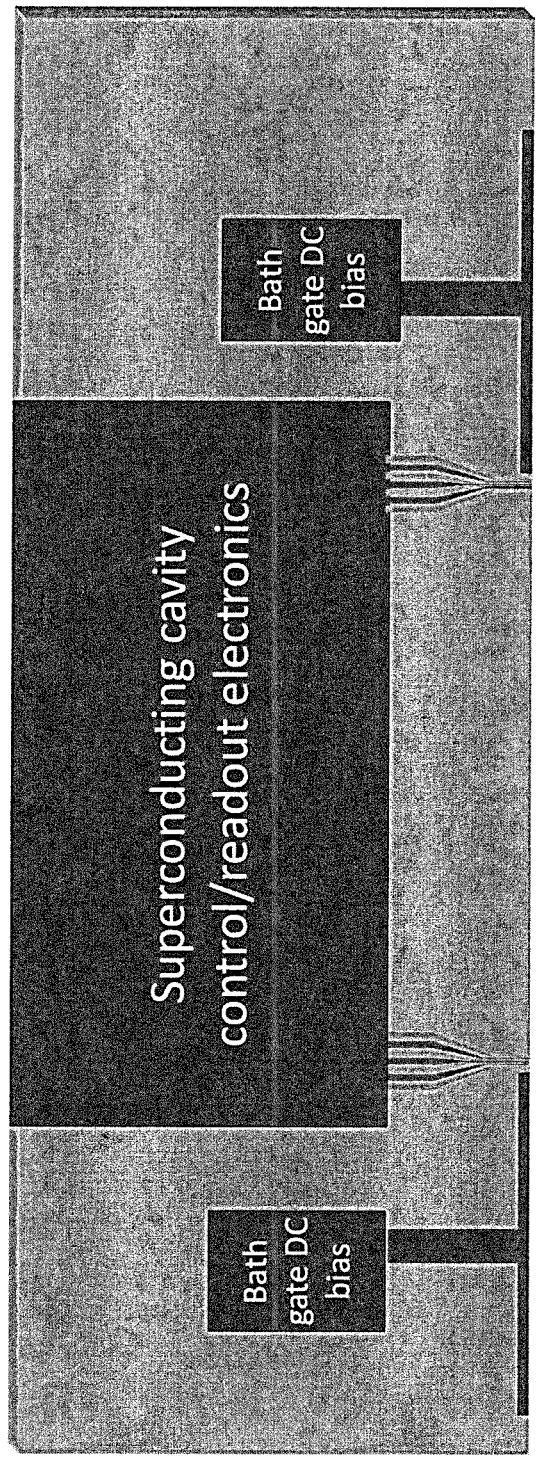
FIG. 11 is a diagram illustrating a separate gate chip containing a superconducting cavity for control and readout of two disjoint induced quantum dot systems in accordance with an embodiment of the present invention.

These linear quantum dot quantum computers induced by the multiple lead wires can be extended to larger quantum computers (beyond linear, nearest-neighbor coupling) by coupling spins to a superconducting cavity as described above but having that cavity connected to two or more lead wires across the gate chip(s). In addition to superconducting-based readout approaches, qubit entangling protocols may be employed via superconducting cavity or transmission lines. By putting the cavity on the gate chip, see FIG. 11, we can optimize for high Q, where certain protocols may benefit from high-Q resonators. Resonators deposited on typical SiGe dot wafers, for example, tend to have Qs<<100,000 as compared to millions achieved on clean wafers. A similar approach can be made with a flip-chip resonator and a traditional dot chip, but our approach should make fabrication much simpler. It also allows networking of small qubit registers enabling a 1.5D quantum geometry.

Depending on the embodiment, certain acts, events, or functions of any of the methods described herein can be performed in a different sequence, can be added, merged, or left out altogether. Not all described acts or events are necessarily required for the practice of any claimed method. Moreover, in certain embodiments, acts or events can be performed concurrently, rather than sequentially.

While the above description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments described herein can be embodied within a form that may not provide all of the features and benefits set forth herein, as some features can be used or practiced separately from others. The scope of the invention is indicated by the appended claims rather than the foregoing description. All changes which come within the meaning and range of equivalency of the claims are to be embraced within their scope.

We claim:

1. A method, comprising:
    positioning at least one lead wire of a gate chip at a distance of less than 10 nm from a semiconductor heterostructure, the lead wire having a cross sectional width between 5 nm and 30 nm, the semiconductor heterostructure comprising a surface layer and at least one subsurface layer;
    inducing a quantum dot in the semiconductor heterostructure, wherein an electrostatic potential is induced in the subsurface layer by applying a voltage between 0.01 V and 0.2 V to the lead wire such than an orbital energy for a given charge carrier of the induced quantum dot is larger than an energy level of an effective temperature bath;
    loading a charge carrier into the subsurface layer;
    detecting the charge carrier in the subsurface layer of the semiconductor heterostructure by:
        emitting a radio-frequency pulse using a resonator having a Q factor of at least $10^3$ coupled to the at least one lead wire of the gate chip;
        detecting a reflected pulse of the emitted radio-frequency pulse; and
        determining a phase shift of the reflected pulse relative to the emitted radio-frequency pulse; and
    characterizing the quantum dot by measuring a valley splitting of the quantum dot.

2. The method in accordance with claim 1, wherein measuring the valley splitting comprises:
    applying an in-plane magnetic field from 0 to a value large enough that a Zeeman splitting is larger than the valley splitting;
    increasing temperature to about 1 Kelvin to populate energy states that anticross when a Zeeman energy is close to the valley splitting;
    detecting a phase shift of a reflected radio-frequency pulse sent through the resonator coupled to the gate chip; and
    determining the valley splitting by monitoring the peak of the phase shift while sweeping the in-plane magnetic field to equate the Zeeman energy at the peak with the valley splitting.

3. The method in accordance with claim 1, wherein loading the charge carrier comprises loading two charge carriers, and wherein measuring the valley splitting comprises:
    applying an in-plane magnetic field from 0 to a value large enough that a Zeeman splitting is larger than the valley splitting;
    detecting a phase shift of a reflected radio-frequency pulse sent through the resonator coupled to the gate chip; and
    determining the valley splitting by monitoring the peak of the phase shift while sweeping the in-plane magnetic field to equate a Zeeman energy at the peak with the valley splitting.

4. The method in accordance with claim 1, wherein inducing the quantum dot comprises inducing a double quantum dot in the subsurface layer by applying voltages to at least two lead wires, and wherein measuring the valley splitting comprises:
    increasing temperature into a range between 0.1K and 0.5K, at zero detuning to populate the two lowest energy levels;
    changing the detuning between the two quantum dots from 0 to a value larger than the valley splitting by changing the voltages applied to the lead wires;
    detecting a phase shift of a reflected radio-frequency pulse sent through the resonator coupled to the gate chip; and
    determining the valley splitting by monitoring the peak of the phase shift while sweeping the detuning to equate the detuning at the peak with the valley splitting.

* * * * *

UNITED STATES PATENT AND TRADEMARK OFFICE
CERTIFICATE OF CORRECTION

PATENT NO. : 11,810,968 B1
APPLICATION NO. : 17/864617
DATED : November 7, 2023
INVENTOR(S) : Charles G. Tahan et al.

It is certified that error appears in the above-identified patent and that said Letters Patent is hereby corrected as shown below:

In the Specification

Column 2, Line 4, the terms "hetero structure" should correctly read -- heterostructure --.

Column 5, Line 12, the term and character "co," should correctly read -- $\omega_r$ --.

Column 5, Line 45, the terms and characters "$E_i(V_g) = E_i(V_g^0) + \frac{\partial E_i}{\partial V_o}\delta V_g + \frac{1}{2}\frac{\partial^2 E_i}{\partial V_g^2}\delta V_g^2$," should correctly read -- $E_i(V_g) = E_i(V_g^0) + \frac{\partial E_i}{\partial V_g}\delta V_g + \frac{1}{2}\frac{\partial^2 E_i}{\partial V_g^2}\delta V_g^2$ --.

Column 7, Line 20, the term "Co" should correctly read -- $C_{q,i}$ --.

Column 7, Line 66, the terms and characters "$\Delta_a/kT \sim \Delta_{10}/\omega_r \sim 10^{-1} - 10^{-2}$" should correctly read -- $\Delta_a/kT \sim \Delta_a/\omega_r \sim 10^{-1} - 10^{-2}$ --.

Column 9, Line 19, the terms "hetero structure" should correctly read -- heterostructure. --.

Column 12, Line 8, the character and terms "— ns" should correctly read -- ~ns --.

Signed and Sealed this
Eleventh Day of June, 2024

*Katherine Kelly Vidal*
Katherine Kelly Vidal
*Director of the United States Patent and Trademark Office*